(12) United States Patent
Smith et al.

(10) Patent No.: US 8,345,134 B2
(45) Date of Patent: Jan. 1, 2013

(54) INDIUM TIN OXIDE GATE CHARGE COUPLED DEVICE

(75) Inventors: Joseph T. Smith, Columbia, MD (US); Bron R. Frias, Catonsville, MD (US); Paul A. Tittel, Columbia, MD (US); Robert R. Shiskowski, Eldersburg, MD (US); Nathan Bluzer, Rockville, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 319 days.

(21) Appl. No.: 12/759,472

(22) Filed: Apr. 13, 2010

(65) Prior Publication Data

US 2011/0249160 A1    Oct. 13, 2011

(51) Int. Cl.
 *H04N 5/335* (2006.01)
 *H01L 27/148* (2006.01)
 *H01L 21/00* (2006.01)
(52) U.S. Cl. ............................ 348/294; 257/215; 438/75
(58) Field of Classification Search ........................ None
 See application file for complete search history.

(56) References Cited

U.S. PATENT DOCUMENTS

| | | | |
|---|---|---|---|
| 5,292,682 A * | 3/1994 | Stevens et al. | 438/144 |
| 5,557,121 A | 9/1996 | Kozuka et al. | |
| 5,798,542 A | 8/1998 | Anagnostopoulos et al. | |
| 5,804,845 A | 9/1998 | Anagnostopoulos et al. | |
| 6,001,668 A * | 12/1999 | Anagnostopoulos et al. | 438/70 |
| 7,439,137 B2 * | 10/2008 | Ishida et al. | 438/270 |
| 7,851,822 B2 * | 12/2010 | Meisenzahl | 257/183.1 |
| 2008/0224136 A1 | 9/2008 | Wang et al. | |

* cited by examiner

*Primary Examiner* — Luong T Nguyen
(74) *Attorney, Agent, or Firm* — Tarolli, Sundheim, Covell & Tummino LLP

(57) ABSTRACT

An Indium Tin Oxide (ITO) gate charge coupled device (CCD) is provided. The CCD device comprises a CCD structure having a substrate layer, an oxide layer over the substrate layer, a nitride layer over the oxide layer and a plurality of parallel ITO gates extending over the nitride layer. The CCD device further comprises a plurality of substantially similarly sized channel stop regions in the substrate layer that extend transversely relative to the ITO gates, such that a given pair of channel stop regions defining a pixel column of the CCD structure. The CCD device also comprises a plurality of vent openings that extend through the nitride layer along the plurality of substantially similarly sized channel stop regions to allow for penetration of hydrogen to at least one of the oxide layer and the substrate layer.

7 Claims, 6 Drawing Sheets

INDIUM TIN OXIDE GATE CHARGE COUPLED DEVICE

TECHNICAL FIELD

The present invention relates generally to imaging, and more particularly to indium tin oxide charge coupled device.

BACKGROUND

An imaging charge-coupled device (CCD) is a silicon-based microelectronic device comprised of an array of closely spaced metal-oxide semiconductor (MOS) diodes that convert incident light (photons) into electronic charge. Using a lens, an image is focused onto the CCD pixel array. Incident photons are absorbed in a silicon substrate, creating electron-hole pairs. The photo-generated electrons are attracted to a positively biased CCD gate electrode which then traps the electrons (charge) within a potential well formed under the CCD gate electrode, with the trapped charge density (number of electrons) proportional to the intensity of the incident light. To read out the captured charge-based image, a sequence of voltage pulses are applied to the gate electrodes to linearly transfer the trapped charge packet along individual columns and into an external electrometer that then converts the collected charge into a voltage proportional to the gray scale of the incident image. The individual columns are electrically isolated from each other using P+ doped (channel stop) regions.

Recent consumer, industrial, and Government demand for ever higher resolution digital cameras as well as cell phones with integrated cameras (i.e., more mega-pixels) has rapidly forced a shrink in the size of imaging pixels to provide the required increased resolution while still maintaining comparable or even smaller die sizes to keep manufacturing costs down. Avoiding degradation in digital image quality becomes more challenging as pixel sizes are aggressively shrunk due to the fact that less pixel (silicon) area is available to both collect and transfer photo-generated charge. Not surprisingly and with no changes to the CCD pixel structure, reducing the size of the pixel results in less area available to store charge. The effect is a reduction in the CCD dynamic range, which results in degraded image quality for an equivalent image capture interval. While the CCD pixel charge handling capacity sets an upper limit on the maximum signal that can be captured without degradation, the dark or leakage current sets the lower limit on the minimum detectable signal (dimmest image) within the sample period. In CCD's, one of the dominant sources of dark current are interface states present at the silicon to gate dielectric (oxide) interface.

SUMMARY

In accordance with one aspect of the present invention, an Indium Tin Oxide (ITO) gate charge coupled device (CCD) is provided. The CCD device comprises a CCD structure having a substrate layer, an oxide layer over the substrate layer, a nitride layer over the oxide layer and a plurality of parallel ITO gates extending over the nitride layer. The CCD device further comprises a plurality of substantially similarly sized channel stop regions in the substrate layer that extend transversely relative to the ITO gates, such that a given pair of channel stop regions define a pixel column of the CCD structure. The CCD device also comprises a plurality of vent openings that extend through the nitride layer along the plurality of substantially similarly sized channel stop regions to allow for penetration of hydrogen to at least one of the oxide layer and the substrate layer.

In another aspect of the invention, a method is provided for fabricating an ITO gate CCD. The method comprises providing a substrate layer, an oxide layer over the substrate layer and a nitride layer over the oxide layer. The method further comprises doping the substrate layer to form a plurality of substantially similarly sized channel stop regions in the substrate layer, such that a given pair of channel stop regions define a pixel column of the CCD structure. The method also comprises etching a plurality of spaced apart vent openings that extend through the nitride layer along the plurality of substantially similarly sized channel stop regions, forming a plurality of parallel ITO gates transverse to the channel stop regions and extending over the nitride layer and performing a hydrogen sinter on the CCD to neutralize interface states of at least one of the oxide layer and the substrate layer.

In yet another aspect of the present invention, a method for fabricating an ITO gate CCD is provided. The method comprises providing a silicon substrate layer, forming an oxide layer over the silicon substrate layer, forming a nitride layer over the oxide layer and doping the substrate layer to form a plurality of substantially similarly sized channel stop regions in the substrate layer, such that a given pair of channel stop regions define a pixel column of the CCD structure. The method further comprises forming a plurality of parallel ITO gates space apart by gaps and being transverse to the channel stop regions and extending over the nitride layer, etching a plurality of spaced apart vent openings that extend through the nitride layer along the plurality of substantially similarly sized channel stop regions and that reside substantially within gaps between adjacent ITO gates and performing a hydrogen sinter on the CCD to neutralize interface states of at least one of the oxide layer and the substrate layer.

DETAILED DESCRIPTION

The present invention provides for an all Indium Tin Oxide (ITO) gate charge coupled device (CCD) and a method of forming the CCD that employs hydrogen vent openings formed in a nitride barrier layer. The hydrogen vent openings are aligned along similarly sized P+ doped channel stop regions that defined pixel columns. Similar sized P+ doped channel stop regions provide increased charge storage areas when scaling down the CCD down in size compared to different sized P+ doped channel stop regions. The hydrogen vent openings provide for the ability to perform a high temperature hydrogen (H2) sinter of CCD wafers near the end of the semiconductor wafer processing sequence to neutralize interface states between the oxide layer and the silicon beneath the nitride layer. Forming the hydrogen vent openings over the existing P+ doped channel stop regions also neutralizes the effects from any diffusion of p-type doped Indium (from the p-type doped ITO gates) through the vent openings into the P+ doped channel stop regions. Forming the hydrogen vent openings between ITO gates also limits the amount of indium diffusion from the ITO gates into the P+ channel stop regions.

Figure 1:
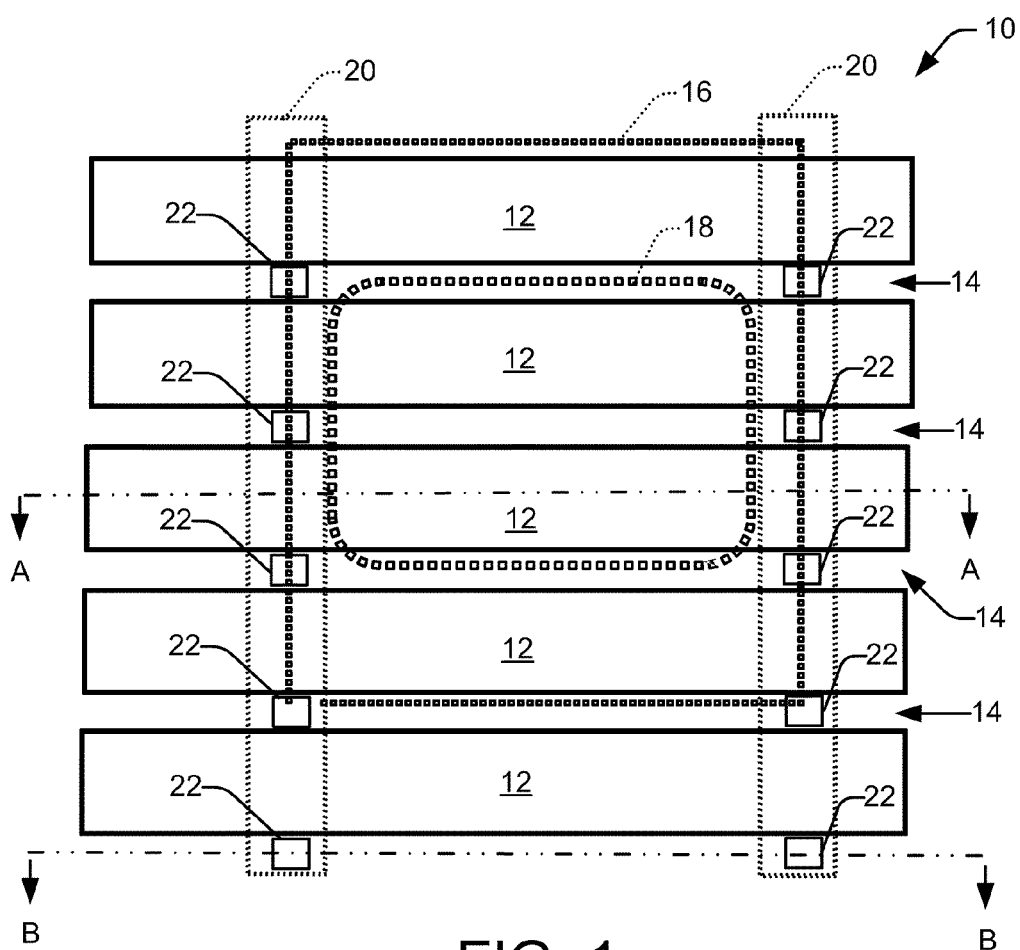
FIG. 1 illustrates a top schematic view of an all ITO gate CCD structure in accordance with an aspect of the present invention.

FIG. 1 illustrates a top schematic view of an all ITO gate CCD structure 10 in accordance with an aspect of the present invention. The CCD structure 10 is a portion of a CCD that provides an illustration of a pixel of the CCD. The CCD structure 10 includes a plurality of ITO gates 12 that overlay a substrate 30 and that extend laterally across the CCD structure 10 and are spaced apart by generally evenly spaced gaps 14. The ITO gates 12 are formed of a p-type doped indium material. A pair of substantially similarly sized P+ channel stop regions 20 extends transversely relative to the ITO gates 12 and define a pixel column of the CCD structure 10. The pixel column includes a plurality of pixels (not shown) that form the column. In the view illustrated in FIG. 1, a first pixel is defined by a pixel region 16 that includes a charge storage area 18. The CCD is a four phase CCD and includes four ITO gates associated with each pixel.

It is to be appreciated that the present invention is not limited to a four phase CCD but could be employed in two phase, three phase or other number of phase type CCDs. A top and bottom gate of the four ITO gates 12 are considered blocking gates and the middle two gates reside over the charge storage region 18 and are considered accepting gates. A plurality of vent openings 22 are disposed along the P+ doped channel stop regions 20 and reside at least for the most part substantially in the gaps between adjacent ITO gates 12.

Figure 2:
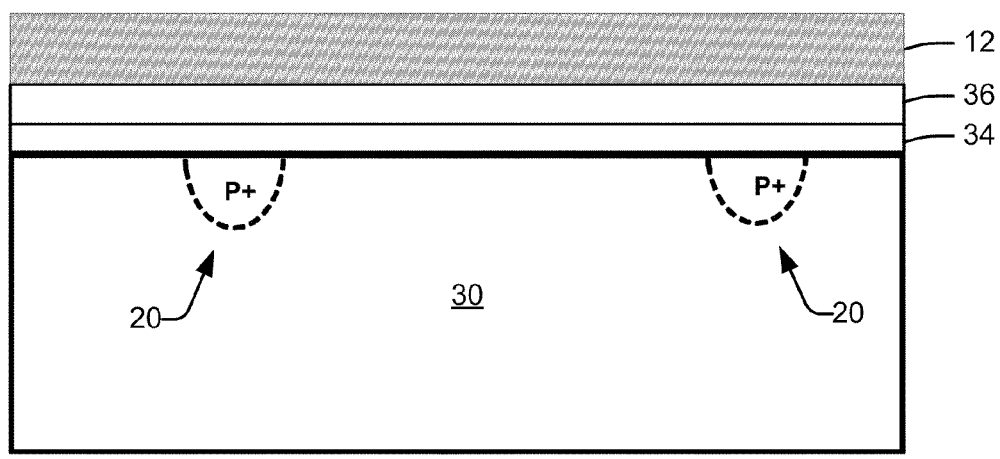
FIG. 2 illustrates a cross-sectional view of the ITO gate CCD structure of FIG. 1 along the lines A-A.

FIG. 2 illustrates a cross-sectional view of the ITO gate CCD structure 10 of FIG. 1 along the lines A-A. As illustrated in FIG. 2, the pair of P+ channel stop regions 20 that define a column of the CCD structure 10 extend into a portion of the silicon substrate 30. An oxide layer 34 overlies the silicon substrate 30 and a nitride layer 36 overlies the oxide layer 34. The ITO gates 12 are formed over the nitride layer 36. The nitride layer 36 provides a barrier for diffusion of the ITO material into the oxide layer 34 and the silicon substrate 30. However, the nitride layer 36 also acts as a barrier layer to a subsequent high temperature hydrogen (H2) sinter of the CCD structure 10 near the end of the semiconductor wafer processing sequence to neutralize interface states between the oxide layer 34 and the silicon 30 beneath the nitride layer 36.

Figure 3:
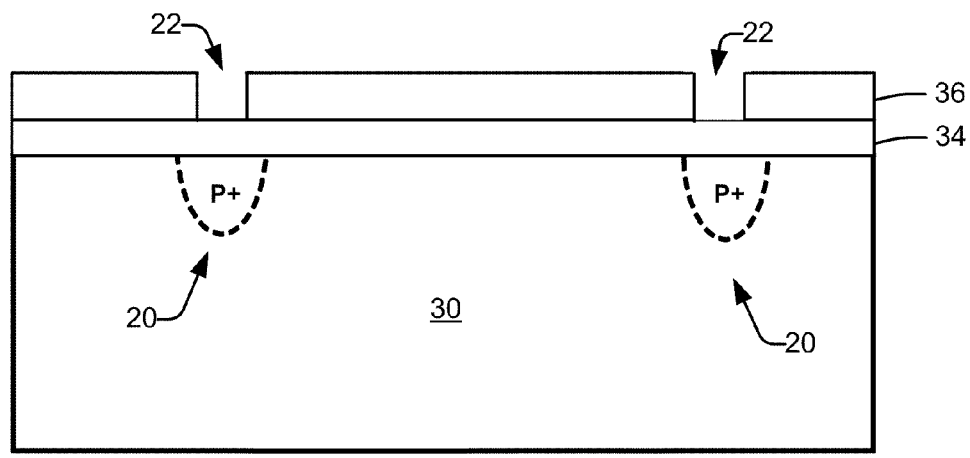
FIG. 3 illustrates a cross-sectional view of the ITO gate CCD structure of FIG. 1 along the lines B-B.

FIG. 3 illustrates a cross-sectional view of the ITO gate CCD structure 10 of FIG. 1 along the lines B-B. As illustrated in FIG. 3, the pair of P+ channel stop regions 20 that define a pixel column of the CCD structure 10 extend into a portion of the silicon substrate 30. The oxide layer 34 overlies the silicon substrate 30 and the nitride layer 36 overlies the oxide layer 34. The spaced apart ITO gates 12 overlying the nitride layer 36 have been left out of FIG. 3 for the sake of simplicity. The plurality of vent openings 40 in the nitride layer 36 are provided along the P+ channel stop regions 20 and reside at least for the most part substantially between adjacent ITO gates 12 to allow for penetration of a subsequent high temperature hydrogen (H2) sinter processing sequence to neutralize interface states between the oxide layer 34 and the silicon 30 beneath the nitride layer 36.

Figure 4:
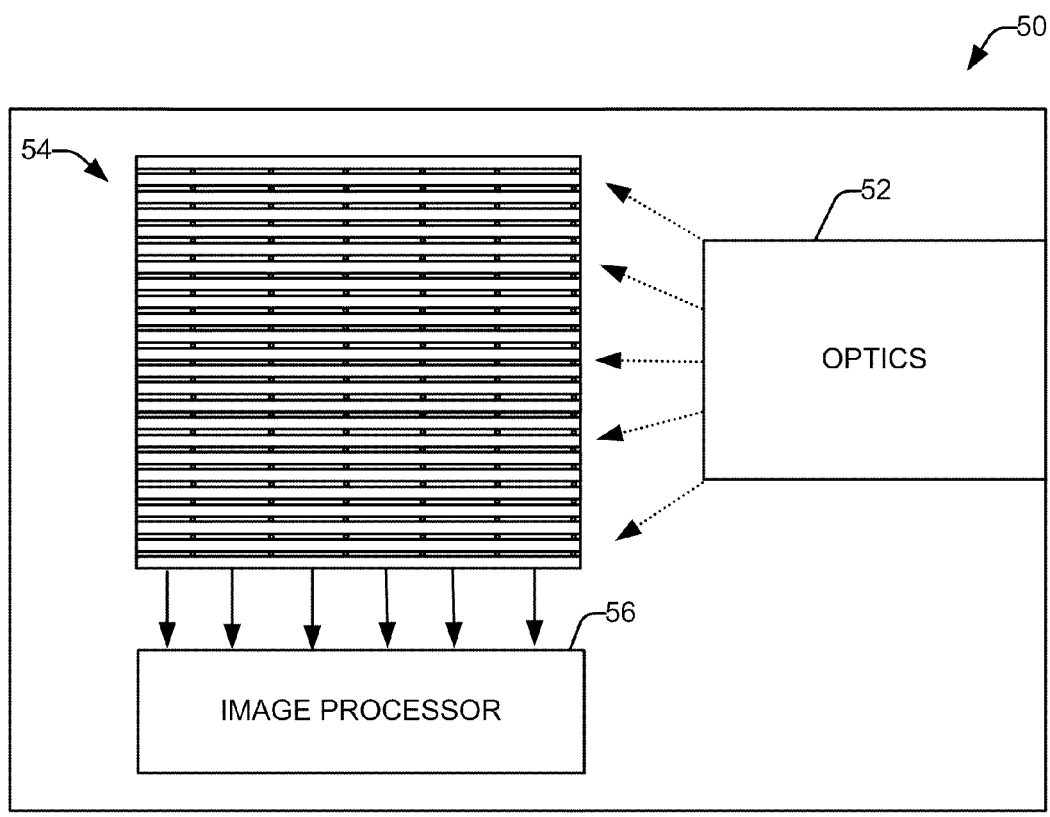
FIG. 4 illustrates schematic diagram of an image system in accordance with an aspect of the present invention.

FIG. 4 illustrates schematic diagram of an image system 50 in accordance with an aspect of the present invention. The image system 50 includes optics 52 for providing and focusing images onto an all ITO gate CCD structure 54 having vent openings in a barrier nitride layer that resides below the ITO gates and above a silicon substrate. The vent openings are disposed along substantially similarly sized P+ channel stop regions that define pixel columns and reside at least for the most part substantially between adjacent ITO gates to allow for penetration of a subsequent high temperature hydrogen (H2) sinter processing sequence to neutralize interface states between layers residing below the nitride barrier layer. The image system 50 further comprises an image processor 56 coupled to the CCD 54 and configured to process pixel data shifted along each pixel column for processing by the image processor 56.

Figure 5:
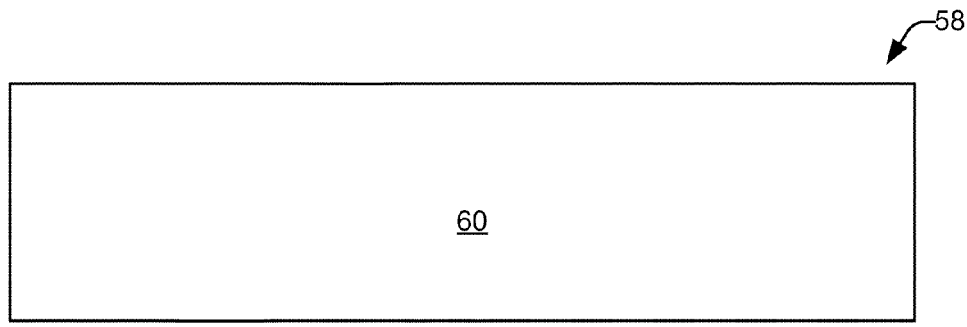
FIG. 5 illustrates a schematic cross-sectional view of a silicon substrate in accordance with an aspect of the present invention.
Figure 6:
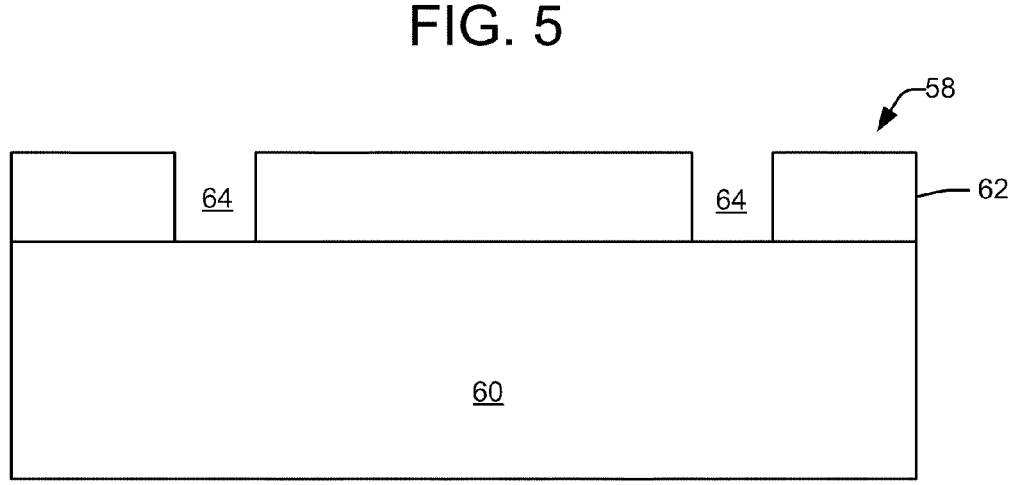
FIG. 6 illustrates a schematic cross-sectional view of the structure of FIG. 5 after a photoresist material layer has been deposited and patterned over the silicon substrate in accordance with an aspect of the present invention.
Figure 7:
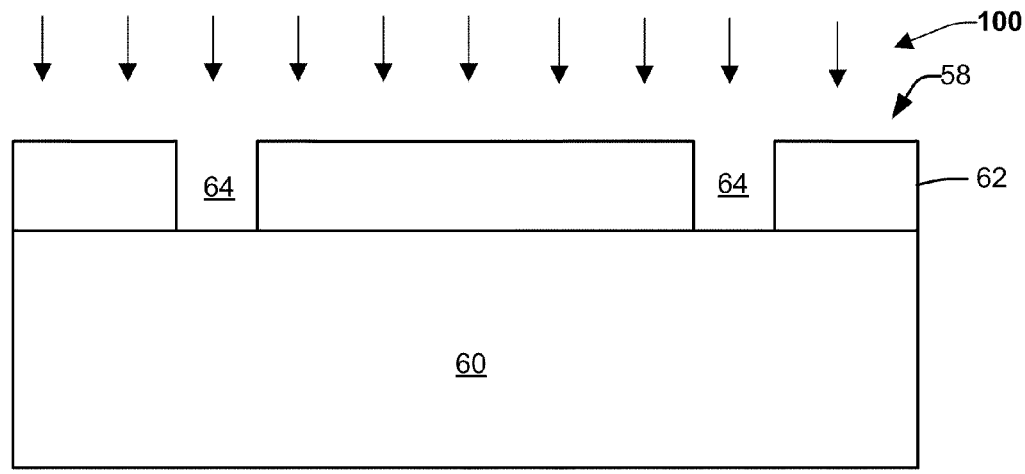
FIG. 7 illustrates a schematic cross-sectional view of the structure of FIG. 6 undergoing a dopant implant in accordance with an aspect of the present invention.
Figure 8:
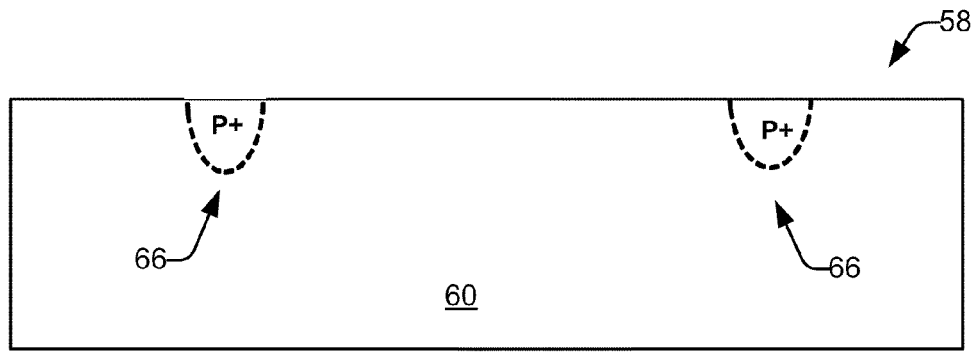
FIG. 8 illustrates a schematic cross-sectional view of the structure of FIG. 7 after undergoing a strip of excess photoresist in accordance with an aspect of the present invention.

Turning now to FIGS. 5-14, fabrication in connection with forming the CCD structure 10 of FIGS. 1-3 is discussed. FIG. 5 illustrates a CCD structure 58 in its early stages of fabrication. The CCD structure 58 includes a base or substrate layer 60 comprising silicon, for example. The base 60 provides mechanical support for the device structure 58, and is of a thickness suitable for providing such support. Next, as represented in FIG. 6, a photoresist material layer 62 is applied to cover the structure and is then patterned to expose open regions 64 in the photoresist material layer 62. The photoresist material layer 62 can have a thickness that varies in correspondence with the wavelength of radiation used to pattern the photoresist material layer 62. The photoresist material layer 62 may be formed over the substrate via spin-coating or spin casting deposition techniques, selectively irradiated and developed to form the trench openings 64. FIG. 7 illustrates performing of a P+ implant 100 to achieve the formation of substantially similar sized P+ channel stop regions 66 (FIG. 8) beneath the trench openings 64 of the photoresist material layer 62. The photoresist material layer 62 is thereafter stripped so as to result in the structure shown in FIG. 8.

Figure 9:
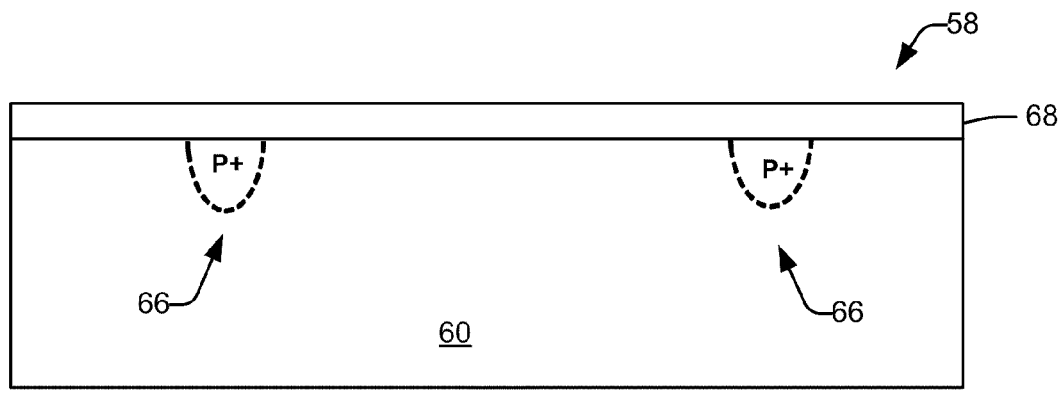
FIG. 9 illustrates a schematic cross-sectional view of the structure of FIG. 8 after undergoing a deposition of an oxide layer in accordance with an aspect of the present invention.
Figure 10:
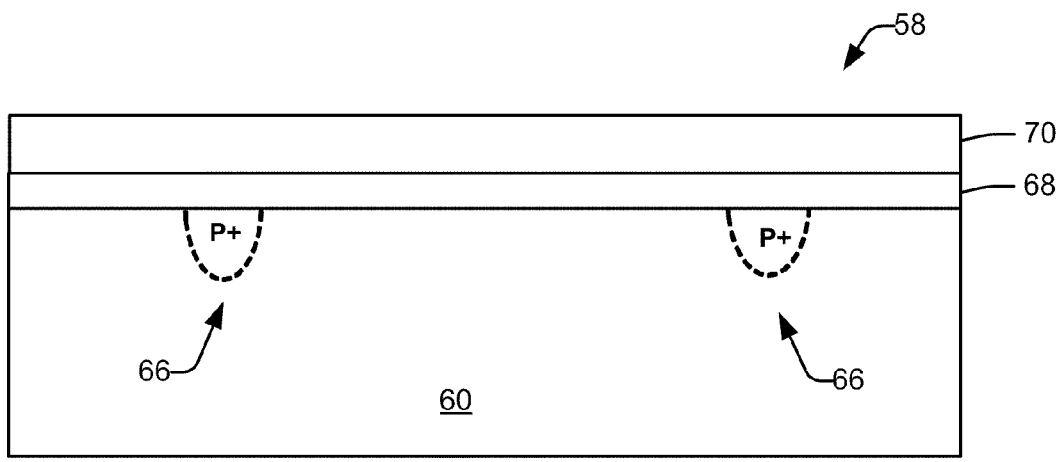
FIG. 10 illustrates a schematic cross-sectional view of the structure of FIG. 9 after undergoing a deposition of a nitride layer in accordance with an aspect of the present invention.

Following the formation of the P+ channel stop regions 66, a layer of oxide material 68 is formed on the structure 58 as illustrated in FIG. 9. The layer of oxide 68 is grown or deposited by other oxide formation techniques. The layer of oxide can be silicon dioxide ($SiO_2$), silicon oxide (SiO) or other oxide material. A nitride material layer 70 is formed over the layer of oxide material 68 as illustrated in FIG. 10. The nitride material layer 70 can be formed using chemical vapor deposition (CVD) or other nitride formation techniques. The nitride material layer 70 can be silicon nitride ($Si_3N_4$), (SiN), or other nitride material that can act as a barrier layer between ITO gates and the oxide layer 68 and silicon substrate 60. It is to be appreciated that multiple insulating layers of oxides and/or nitrides can be implemented to carry out the present invention. It is to be appreciated that the P+ channel stop regions 66 can be formed prior to or after deposition of the oxide layer 68 and/or nitride layer 70.

Figure 11:
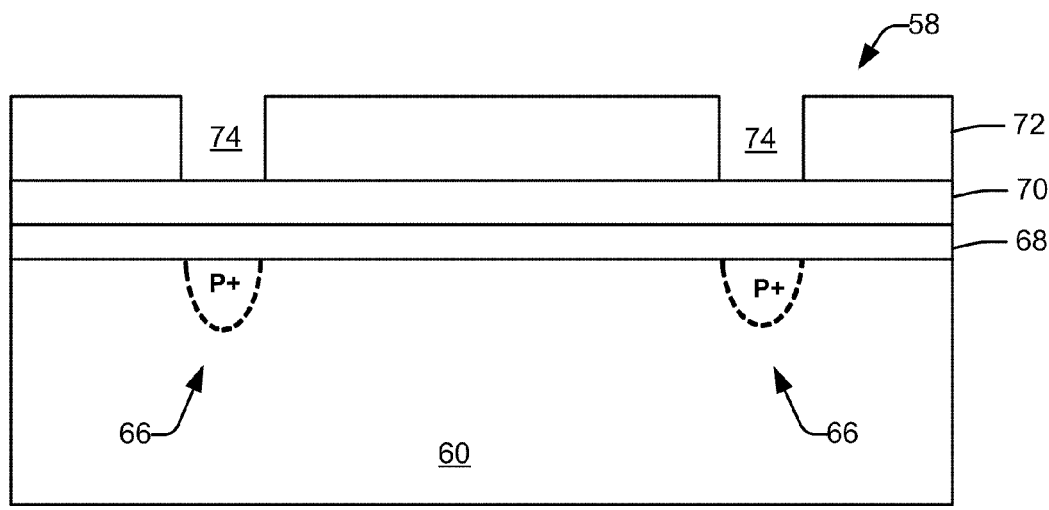
FIG. 11 illustrates a schematic cross-sectional view of the structure of FIG. 10 after a photoresist material layer has been deposited and patterned over the nitride layer in accordance with an aspect of the present invention.
Figure 12:
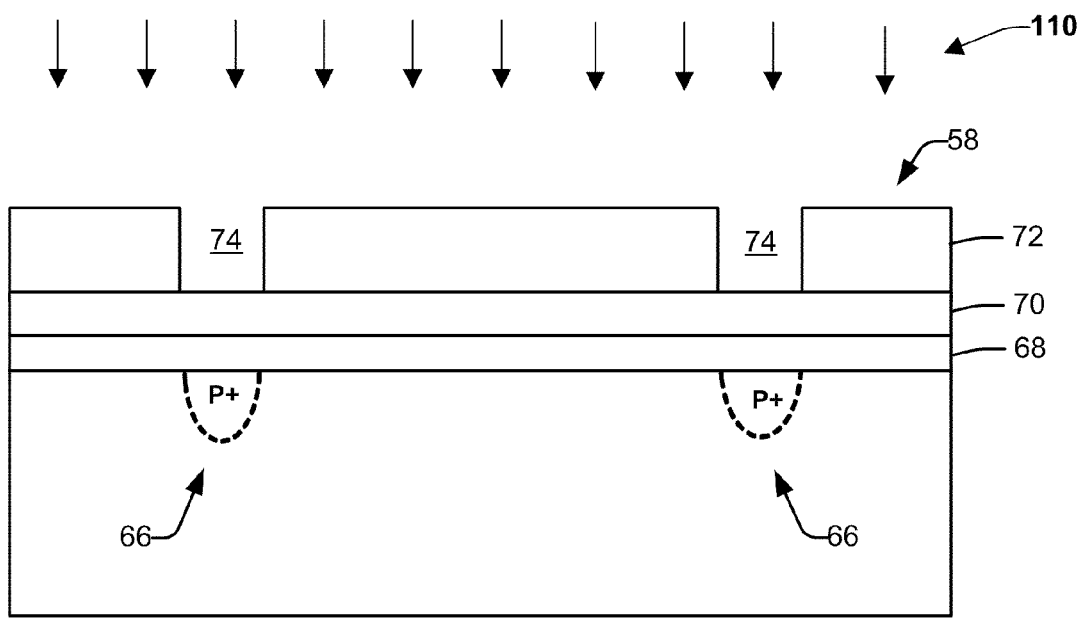
FIG. 12 illustrates a schematic cross-sectional view of the structure of FIG. 11 undergoing an etch step on the nitride layer to form vent openings in accordance with an aspect of the present invention.

Next, as represented in FIG. 11, another photoresist material layer 72 is applied to cover the structure 58 and is then patterned to expose open regions 74 in the photoresist material layer 72. Again, the photoresist material layer 72 can have a thickness that varies in correspondence with the wavelength of radiation used to pattern the photoresist material layer 72. FIG. 12 illustrates performing of an etch step 110 on the nitride layer 70 to form vent openings 76 (FIG. 13) overlying and extending along the P+ channel stop regions 66 and residing for at least the most part between ITO gates (not shown). The etch step 110 employs an etchant which selectively etches the nitride material layer 70 at a faster rate than the underlying oxide material layer 68 and the overlying photoresist material layer 72.

Figure 13:
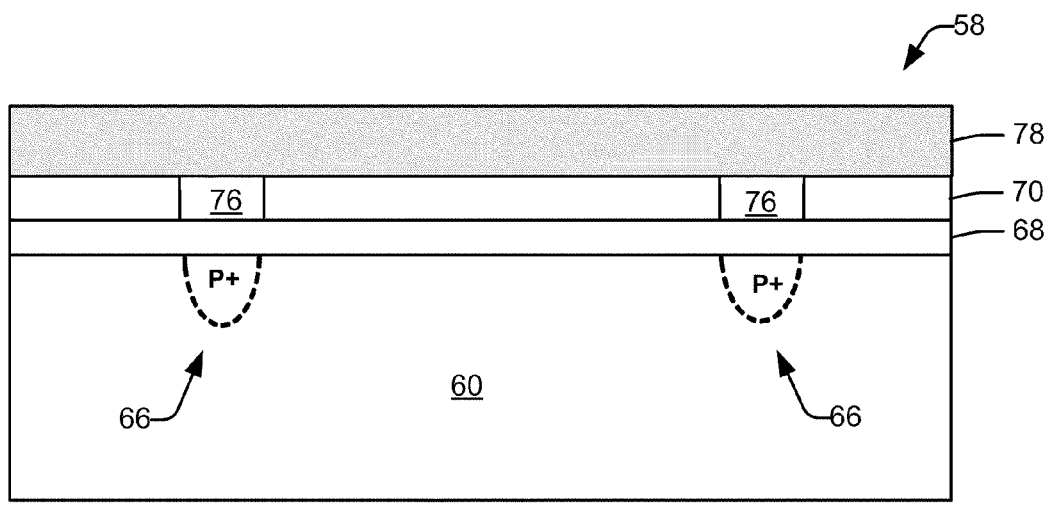
FIG. 13 illustrates a schematic cross-sectional view of the structure of FIG. 12 after undergoing a strip of excess photoresist and after the formation of ITO gates above the nitride layer in accordance with an aspect of the present invention.

The photoresist material layer 72 is thereafter stripped and the ITO gates 78 are formed above the nitride layer 70 so as to result in the structure 58 shown in FIG. 13. The ITO gates 78 can be formed prior to or after the formation of the vent openings 76. The ITO gates 78 can be formed by depositing ITO gate material, forming an etchant mask and etching the ITO gate material to form spaced apart ITO gates.

Figure 14:
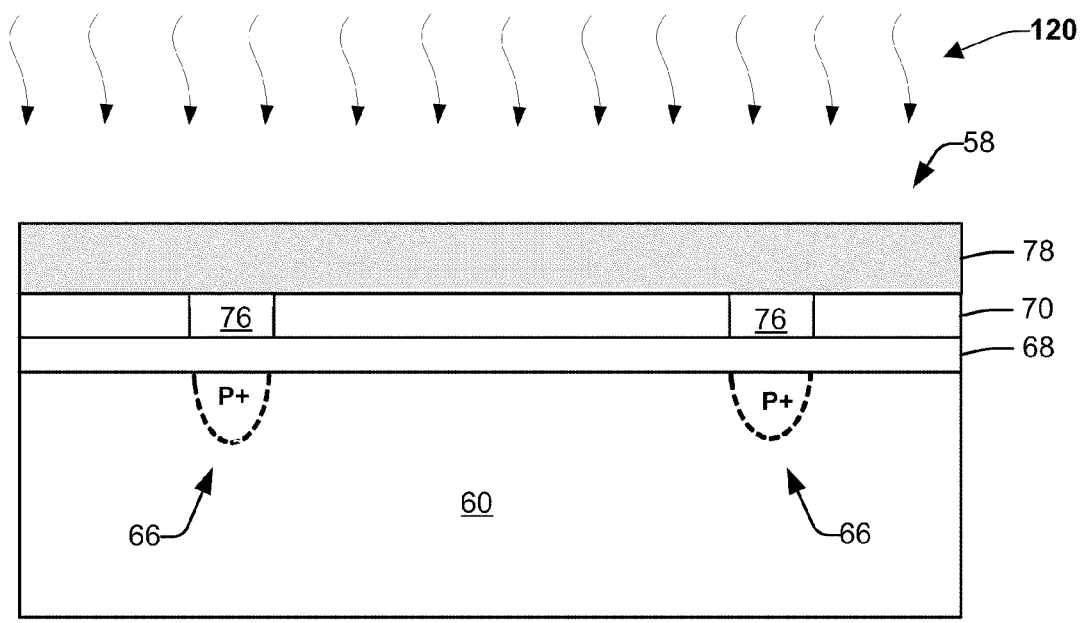
FIG. 14 illustrates a schematic cross-sectional view of the structure of FIG. 13 undergoing a high temperature hydrogen (H2) sinter process in accordance with an aspect of the present invention.

FIG. 14 illustrates the structure 58 of FIG. 13 undergoing a high temperature hydrogen (H2) sinter process 120. The CCD structure can be subjected to a temperature of about 600° to about 700° (e.g., about 650°) for about 15 minutes to about 45 minutes (e.g., about 30 minutes) in a H2 sinter environment. The H2 penetrates the oxide layer 68 and the silicon 60 through the vent openings 76 to neutralize interface states between the oxide layer 68 and the silicon 60 beneath the nitride layer 70.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. An Indium Tin Oxide (ITO) gate charge coupled device (CCD) comprising:
   a CCD structure having a substrate layer, an oxide layer over the substrate layer and a nitride layer over the oxide layer;
   a plurality of parallel ITO gates extending over the nitride layer;
   a plurality of substantially similarly sized channel stop regions in the substrate layer that extend transversely relative to the plurality of parallel ITO gates, a given pair of channel stop regions defining a pixel column of the CCD structure; and
   a plurality of vent openings that extend through the nitride layer along the plurality of substantially similarly sized channel stop regions to allow for penetration of hydrogen to at least one of the oxide layer and the substrate layer.

2. The CCD of claim 1, the plurality of parallel ITO gates being spaced apart by gaps, the vent openings reside substantially in the gaps between adjacent ITO gates.

3. The CCD of claim 1, wherein the substrate layer is silicon.

4. The CCD of claim 1, wherein the CCD is an all ITO gate CCD.

5. The CCD of claim 4, the nitride layer comprising silicon nitride and the oxide layer comprising at least one of silicon oxide and silicon dioxide.

6. The CCD of claim 1, wherein the plurality of parallel ITO gates include p-type doped indium.

7. An imaging system comprising the CCD of claim 1 and further comprising optics for providing images to the CCD and an image processor for processing image data from the CCD.

* * * * *